United States Patent
Puckett et al.

(10) Patent No.: US 10,715,115 B2
(45) Date of Patent: Jul. 14, 2020

(54) CIRCUITS AND METHODS FOR PREVENTING BIAS TEMPERATURE INSTABILITY

(71) Applicant: QUALCOMM Incorporated, San Diego, CA (US)

(72) Inventors: Joshua Puckett, Raleigh, NC (US); Alexander Tessitore, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/152,748

(22) Filed: Oct. 5, 2018

(65) Prior Publication Data

US 2020/0106421 A1    Apr. 2, 2020

Related U.S. Application Data

(60) Provisional application No. 62/739,116, filed on Sep. 28, 2018.

(51) Int. Cl.

| H03K 3/00 | (2006.01) |
|---|---|
| H03K 3/3565 | (2006.01) |
| H03K 3/011 | (2006.01) |
| H03K 5/134 | (2014.01) |

(52) U.S. Cl.
CPC ............ *H03K 3/011* (2013.01); *H03K 5/134* (2014.07)

(58) Field of Classification Search
CPC .............................. H03K 3/011; H03K 5/134
USPC ......................................................... 327/544
See application file for complete search history.

(56) References Cited

U.S. PATENT DOCUMENTS

| 4,464,587 A * | 8/1984 | Suzuki ................ H03K 3/3565 327/206 |
|---|---|---|
| 5,034,623 A * | 7/1991 | McAdams ........... H03K 3/3565 326/62 |
| 5,453,709 A | 9/1995 | Tanimoto et al. |
| 5,663,670 A | 9/1997 | Iadanza et al. |
| 6,310,492 B1 * | 10/2001 | Ikoma ................ H03K 19/0016 326/81 |
| 6,433,602 B1 | 8/2002 | Lall et al. |
| 7,750,705 B2 * | 7/2010 | Ueno ............... H03K 3/356165 326/33 |

(Continued)

OTHER PUBLICATIONS

International Search Report and Written Opinion—PCT/US2019/045149—ISA/EPO—dated Nov. 19, 2019.

*Primary Examiner* — Kenneth B Wells
(74) *Attorney, Agent, or Firm* — Muncy, Geissler, Olds & Lowe, P.C.

(57) ABSTRACT

Circuits and methods for balancing Bias Temperature Instability (BTI) are disclosed. An inverter circuit comprises an inverter input node configured to receive an inverter input signal, wherein the inverter input node is coupled to gates of an inverter pair, wherein the inverter pair includes an inverter pair n-type metal-oxide-semiconductor (NMOS) transistor and an inverter pair p-type metal-oxide-semiconductor (PMOS) transistor, an inverter output node configured to provide an inverter output signal, wherein the inverter output signal is an inversion of the inverter input signal, and at least one balancing transistor configured to balance a voltage at a source of the inverter pair PMOS, a source of the inverter pair NMOS, or any combination thereof.

24 Claims, 7 Drawing Sheets

(56) References Cited

U.S. PATENT DOCUMENTS

| | | | |
|---|---|---|---|
| 8,294,525 B2* | 10/2012 | Bulzacchelli | ......... H03L 7/0995 331/1 A |
| 8,829,964 B1 | 9/2014 | Williams et al. | |
| 9,548,654 B2 | 1/2017 | Yi et al. | |
| 2010/0231280 A1 | 9/2010 | Lee | |
| 2013/0002297 A1 | 1/2013 | Jain et al. | |

* cited by examiner

CIRCUITS AND METHODS FOR PREVENTING BIAS TEMPERATURE INSTABILITY

CROSS-REFERENCE TO RELATED APPLICATION

The present Application for Patent claims the benefit of Provisional Patent Application No. 62/739,116, entitled "CIRCUITS AND METHODS FOR PREVENTING BIAS TEMPERATURE INSTABILITY," filed 28 Sep. 2018, and assigned to the assignee hereof and hereby expressly incorporated herein by reference in its entirety.

INTRODUCTION

Aspects of this disclosure relate generally to circuits, and more particularly to prevention of Bias Temperature Instability (BTI) and the like.

BTI is often encountered in complementary metal-oxide semiconductor (CMOS) applications when a particular CMOS transistor is kept in an ON position for a long duration of time (that is, when a high gate-source voltage differential $V_{gs}$ is maintained across that particular CMOS transistor). During the operational lifetime of an affected CMOS transistor, BTI can cause an increase in the CMOS transistor's threshold voltage and a decrease in the CMOS transistor's drain current, thereby negatively impacting the performance of the device in which the CMOS transistor is provided.

A clock buffer is one example of a CMOS application that can be affected by BTI. Electronic devices typically generate a clock signal, which results in significant power consumption. To save power, these devices may rely on a technique called "clock gating" to save power. Clock gating is performed by turning off a clock signal. In the case of, for example, a clock buffer, the clock signal is the primary input. Accordingly, if the clock signal is set to a particular value for a long period of time, the clock buffer may be affected by BTI. For example, the clock buffer may include one or more CMOS inverter pairs, each CMOS inverter pair comprising a p-type metal oxide semiconductor (PMOS) and an n-type metal oxide semiconductors (NMOS). In the event that the clock signal is held low for long durations, the performance of the PMOS (which experiences a high $V_{gs}$ differential in this scenario) may degrade over time due to BTI. By contrast, if the clock signal is held high for long durations, the NMOS may degrade.

Another example of a CMOS application that is affected by BTI is the static random-access memory (SRAM). In SRAM, a particular memory address may correspond to a particular word line. However, the voltage associated with the word line may remain the same for long periods of time. In particular, the memory address is likely to be accessed infrequently, so for the remainder of the time, the voltage associated with the word line does not change.

Current techniques to combat BTI degradation include provision of higher supply voltages to the affected CMOS transistor (to power through the increased threshold voltage and pump up the drain current), increased timing margins (to decrease the sensitivity of the circuit to BTI degradation of the CMOS transistor), and clock toggling (to decrease the imbalance between ON periods and OFF periods experienced by the CMOS transistor). However, each of these techniques has serious drawbacks. Accordingly, new techniques are required.

SUMMARY

The following summary is an overview provided solely to aid in the description of various aspects of the disclosure and is provided solely for illustration of the aspects and not limitation thereof.

In accordance with aspects of the disclosure, an inverter circuit is provided. The inverter circuit comprises an inverter input node configured to receive an inverter input signal, wherein the inverter input node is coupled to gates of an inverter pair, wherein the inverter pair includes an inverter pair NMOS and an inverter pair PMOS, an inverter output node configured to provide an inverter output signal, wherein the inverter output signal is an inversion of the inverter input signal, and at least one balancing transistor configured to balance a voltage at a source of the inverter pair PMOS, a source of the inverter pair NMOS, or any combination thereof.

In accordance with other aspects of the disclosure, a method is provided. The method may comprise receiving an inverter input signal at an inverter input node, wherein the inverter input node is coupled to gates of an inverter pair, wherein the inverter pair includes an inverter pair NMOS and an inverter pair PMOS, providing an output signal of the means for inverting at an output node, wherein the output signal is an inversion of the input signal, and balancing a gate-source voltage differential at a source of the inverter pair PMOS, a source of the inverter pair NMOS, or any combination thereof.

In accordance with yet other aspects of the disclosure, an apparatus is provided. The apparatus may comprise means for inverting. The means for inverting may comprise means for receiving an input signal, wherein the means for receiving an input signal includes an input node that is coupled to gates of an inverter pair, wherein the inverter pair includes an inverter pair NMOS and an inverter pair PMOS, means for providing an output signal of the means for inverting at an output node, wherein the output signal is an inversion of the input signal, and means for balancing a gate-source voltage differential at a source of the inverter pair PMOS, a source of the inverter pair NMOS, or any combination thereof.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION

As noted above, current techniques to combat BTI degradation include provision of higher supply voltages to the affected CMOS transistor (to power through the increased threshold voltage and pump up the drain current), increased timing margins (to decrease the sensitivity of the circuit to BTI degradation of the CMOS transistor), and clock toggling (to decrease the imbalance between ON periods and OFF periods experienced by the CMOS transistor). However, each of these techniques has serious drawbacks.

Accordingly, in accordance with aspects of the disclosure, a PMOS-protected inverter structure is proposed. The inverter may have an inverter pair PMOS and an inverter pair NMOS. To prevent BTI degradation of the inverter pair PMOS, a balancing transistor may be provided to balance a voltage at a source of the inverter pair PMOS. The balancing may be performed in response to receiving of a low voltage at an input node of the inverter structure, i.e., the gates of the inverter pair. If the low voltage is received for a long duration, the balancing transistor may, by decreasing the voltage at the source of the inverter pair PMOS, decrease the gate-source voltage differential $V_{gs}$ associated with the inverter pair PMOS. In this manner, BTI degradation of the inverter pair PMOS due to a sustained low voltage may be prevented.

In accordance with other aspects of the disclosure, an NMOS-protected inverter structure is proposed. The NMOS-protected inverter structure may be analogous in some respects to the PMOS-protected inverter structure. To prevent BTI degradation of the inverter pair NMOS, a balancing transistor may be provided to increase a voltage at a source of the inverter pair NMOS. The increasing may be performed in response to receiving of a high voltage at an input node of the inverter structure, i.e., the gates of the inverter pair. If the high voltage is received for a long duration, the balancing transistor may, by increasing the voltage at the source of the inverter pair NMOS, decrease the gate-source voltage differential $V_{gs}$ associated with the inverter pair NMOS. In this manner, BTI degradation of the inverter pair NMOS due to a sustained high voltage may be prevented.

In accordance with yet other aspects of the disclosure, a hybrid PMOS/NMOS-protected inverter structure is proposed. The hybrid inverter structure includes two balancing transistors, one of which decreases the voltage at the source of the inverter pair PMOS, and another that increases the voltage at the source of the inverter pair NMOS. In this manner, BTI degradation of the inverter pair due to any sustained voltage may be prevented.

Figure 1:
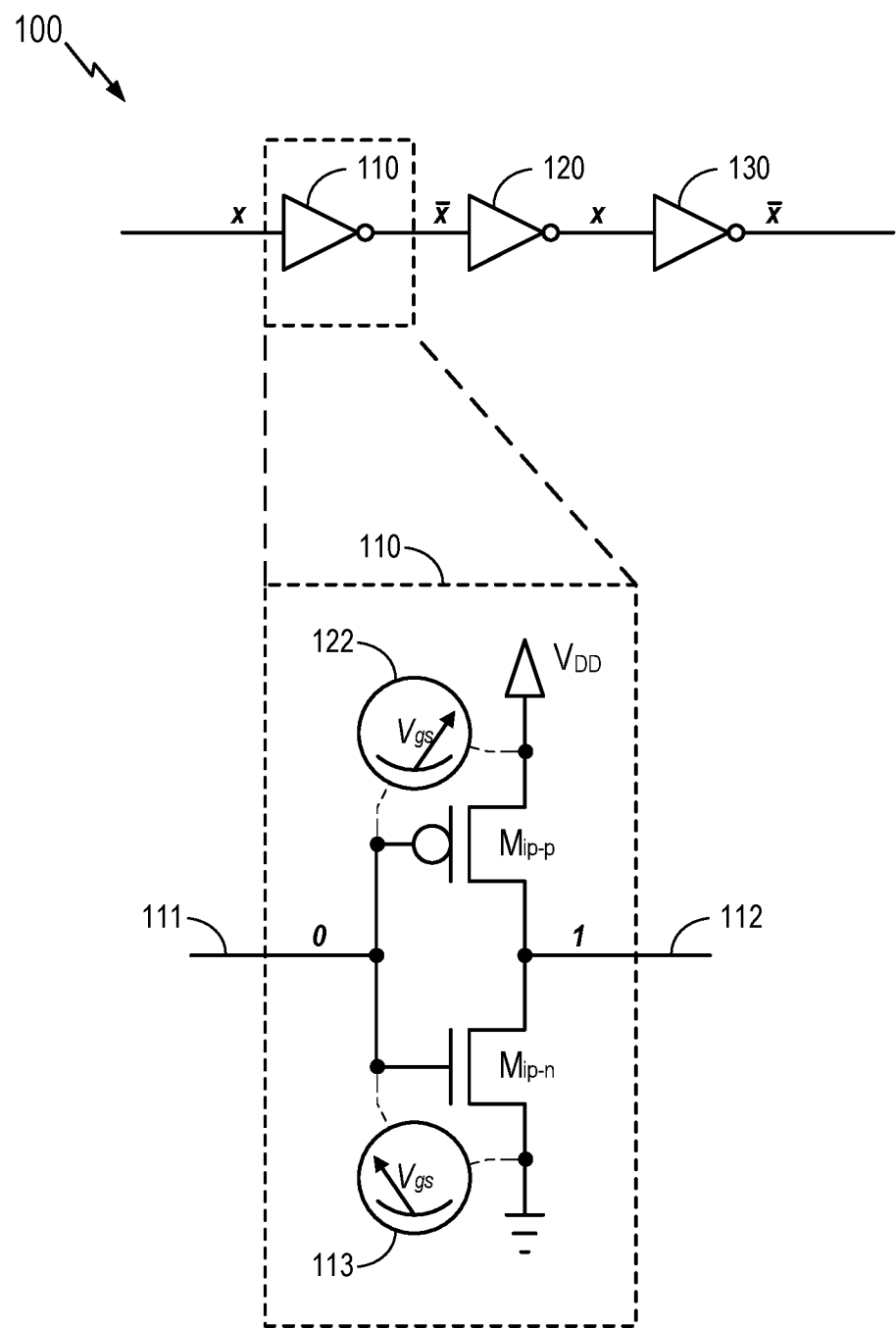
FIG. 1 generally illustrates a series of inverters in accordance with conventional techniques.

FIG. 1 generally illustrates a series of inverters 100 in accordance with conventional techniques.

The series of inverters 100 includes a first inverter 110, a second inverter 120, and a third inverter 130. Each inverter in the series of inverters 100 receives an input and provides an output that is the inverse of the input. In the example, the first inverter 110 is provided with a first input signal x and generates a first output signal $\bar{x}$. The first output signal $\bar{x}$ is provided to the input of the second inverter 120, which generates a second output signal x. The second output signal x is provided to the input of the third inverter 130, which generates a third output signal $\bar{x}$.

In the present disclosure, the signal x and inverted signal $\bar{x}$ may respectively correspond to a low voltage and a high voltage. For example, a low voltage may correspond to "logic zero" and a high voltage may correspond to "logic one", which is the inverse of logic zero. In FIG. 1 and elsewhere, logic zero is depicted as ground (zero voltage) and logic one is depicted as being equal to a power supply voltage $V_{DD}$. However, it will be understood that these are merely examples, and that other suitable voltage values may be substituted for ground and/or $V_{DD}$.

FIG. 1 further depicts a detail of the first inverter 110. The first inverter 110 may include an inverter pair NMOS $M_{ip-n}$ and an inverter pair PMOS $M_{ip-p}$. A source of the inverter pair PMOS $M_{ip-p}$ may be coupled to a power supply $V_{DD}$ and a source of the inverter pair NMOS $M_{ip-n}$ may be coupled to ground. Respective drains of the inverter pair NMOS $M_{ip-n}$ and the inverter pair PMOS $M_{ip-p}$ may be coupled to one another.

The first inverter 110 may further include a first inverter input node 111 and a first inverter output node 112. The first inverter input node 111 may be coupled to respective gates of the inverter pair NMOS $M_{ip-n}$ and the inverter pair PMOS $M_{ip-p}$. The first inverter output node 112 may be coupled to the respective drains of the inverter pair NMOS $M_{ip-n}$ and the inverter pair PMOS $M_{ip-p}$.

In some implementations, the series of inverters 100 may be held in a steady state for a long duration. As noted above, when a gate-source voltage differential $V_{gs}$ of a CMOS transistor is held in a steady state for a long duration, the performance of the transistor may be degraded by BTI. As shown in the example of FIG. 1, a low voltage (for example, logic zero) may be provided to the first inverter input node 111. Accordingly, there may be a low voltage at the gate of the inverter pair PMOS $M_{ip-p}$. However, a high voltage (for example, logic one) is provided at the source of the inverter pair PMOS $M_{ip-p}$ by the power supply $V_{DD}$. Accordingly, an $M_{ip-p}$ gate-source voltage differential 122 may be high in this scenario. If the $M_{ip-p}$ gate-source voltage differential 122 is held high for a long duration, the inverter pair PMOS $M_{ip-p}$ may experience BTI degradation.

In the scenario depicted in FIG. 1, a low voltage is provided to a gate of the inverter pair NMOS $M_{ip-n}$ as well. A source of the inverter pair NMOS $M_{ip-n}$ is coupled to ground, which is also a low voltage. Accordingly, an $M_{ip-n}$ gate-source voltage differential 113 may be low in this scenario, such that BTI degradation is not experienced. However, BTI degradation may be experienced in other scenarios. For example, if a high voltage had been provided to the gates of the first inverter 110, then there may have been a high voltage at the gate of the inverter pair NMOS $M_{ip-n}$ and a low voltage at the source of the inverter pair NMOS $M_{ip-n}$, resulting in a high gate-source voltage differential 113. If the $M_{ip-n}$ gate-source voltage differential 113 remains high for a long duration, then the inverter pair NMOS $M_{ip-n}$ may experience BTI degradation.

The $M_{ip-n}$ gate-source voltage differential 113 and the $M_{ip-p}$ gate-source voltage differential 122 are depicted in FIG. 1 as voltmeters. However, it will be understood that in FIG. 1 and elsewhere in the present disclosure, voltmeters are depicted for purely illustrative purposes, and are not actually included in the circuits depicted.

Figure 2:
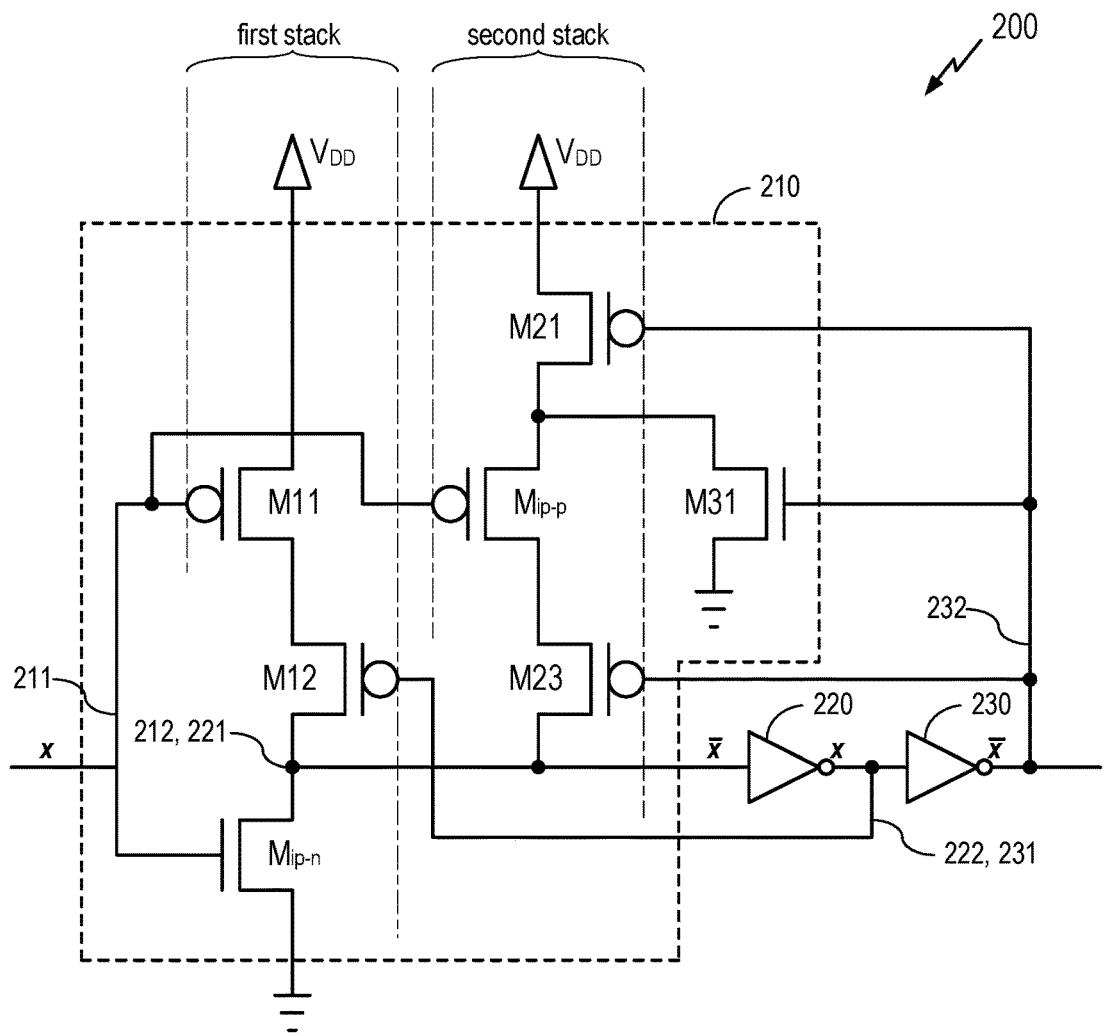
FIG. 2 generally illustrates a series of inverters in accordance with aspects of the disclosure.

FIG. 2 generally illustrates a series of inverters 200 in accordance with aspects of the disclosure.

The series of inverters 200 may be analogous in some respects to the series of inverters 100. For example, like the series of inverters 100, the series of inverters 200 may include a first inverter 210, a second inverter 220, and a third inverter 230. The first inverter 210 may have a first inverter input node 211 and a first inverter output node 212, the second inverter 220 may have a second inverter input node 221 and a second inverter output node 222, and the third inverter 230 may have a third inverter input node 231 and a third inverter output node 232. Each inverter in the series of inverters 200 may receive a logic zero or logic one at an input node and generate the inverse at an output node. The series of inverters 200 are daisy-chained such that the output of one inverter is the input of the next inverter.

The first inverter 210 includes an inverter pair PMOS $M_{ip-p}$ and an inverter pair NMOS $M_{ip-n}$ that are analogous in some respects to the inverter pair PMOS $M_{ip-p}$ and the inverter pair NMOS $M_{ip-n}$ depicted in FIG. 1. For example, like the inverter pair NMOS $M_{ip-n}$ depicted in FIG. 1, the inverter pair NMOS $M_{ip-n}$ depicted in FIG. 2 may include a source coupled to ground, a drain coupled to the first inverter output node 212, and a gate coupled to the first inverter input node 211. Moreover, like the inverter pair PMOS $M_{ip-p}$ depicted in FIG. 1, the inverter pair PMOS $M_{ip-p}$ depicted in FIG. 2 may include a gate that is coupled to the first inverter input node 211.

However, unlike the arrangement depicted in FIG. 1, the inverter pair NMOS $M_{ip-n}$ is included in a first stack of transistors and the inverter pair PMOS $M_{ip-p}$ is included in a second stack of transistors. It will be understood that the terms "first stack" and "second stack" do not imply anything about the relative arrangement of the transistors during fabrication, or the physical disposition/structure of the transistors themselves. Rather, the first stack and second stack are schematic categorizations provided for clarity of illustration.

The first stack of transistors may include a first stack input PMOS M11, a first stack feedback PMOS M12, and the inverter pair NMOS $M_{ip-n}$. As will be understood from FIG. 2, the first stack input PMOS M11 may include a source coupled to a power supply $V_{DD}$, a gate coupled to the input of the inverter, and a drain coupled to the first stack feedback PMOS M12. The first stack feedback PMOS M12 may include a gate coupled to the output of the second inverter 220 (i.e., the second inverter output node 222) and a drain coupled to the inverter pair NMOS $M_{ip-n}$. The inverter pair NMOS $M_{ip-n}$ may include a drain coupled to the output of the first inverter 210 (i.e., the first inverter output node 212) and a source coupled to ground. As noted above, the gate of the inverter pair NMOS $M_{ip-n}$ is coupled to the first inverter input node 211.

The second stack of transistors may include a first feedback PMOS M21, the inverter pair PMOS $M_{ip-p}$, and a second feedback PMOS M23. As will be understood from FIG. 2, the first feedback PMOS M21 may include a source coupled to the power supply $V_{DD}$, a gate coupled to the output of the third inverter 230 (i.e., the third inverter output node 232), and a drain coupled to a source of the inverter pair PMOS $M_{ip-p}$. The inverter pair PMOS $M_{ip-p}$ may include a gate coupled to the input of the first inverter 210 (i.e., the first inverter input node 211) and a drain coupled to the second feedback PMOS M23. The second feedback PMOS M23 may include a gate coupled to the output of the third inverter 230 (i.e., the third inverter output node 232) and a drain coupled to the output of the first inverter 210 (i.e., the first inverter output node 212).

In addition to the first stack of transistors and the second stack of transistors, the first inverter 210 may further include a balancing NMOS M31. The balancing NMOS M31 may include a drain coupled to the source of the inverter pair PMOS $M_{ip-p}$, a gate coupled to the third inverter output node 232 of the third inverter 230, and a source coupled to ground.

Returning to the arrangement of transistors in FIG. 1, it will be recalled that when the input to the first inverter 110 is sustained at a low voltage for a long duration, the $V_{gs}$ associated with the inverter pair PMOS $M_{ip-p}$ remains high for the long duration, leading to BTI degradation of the inverter pair PMOS $M_{ip-p}$. By contrast, and as will be discussed in greater detail below, the arrangement of transistors depicted in FIG. 2 operates to decrease a voltage at a source of the inverter pair PMOS $M_{ip-p}$ in response to a low voltage received at the first inverter input node 211 of the first inverter 210, thereby balancing the voltages at the gate and source. Accordingly, the inverter pair PMOS $M_{ip-p}$ is less subject to BTI degradation when provided in the arrangement depicted in FIG. 2.

Figure 3:
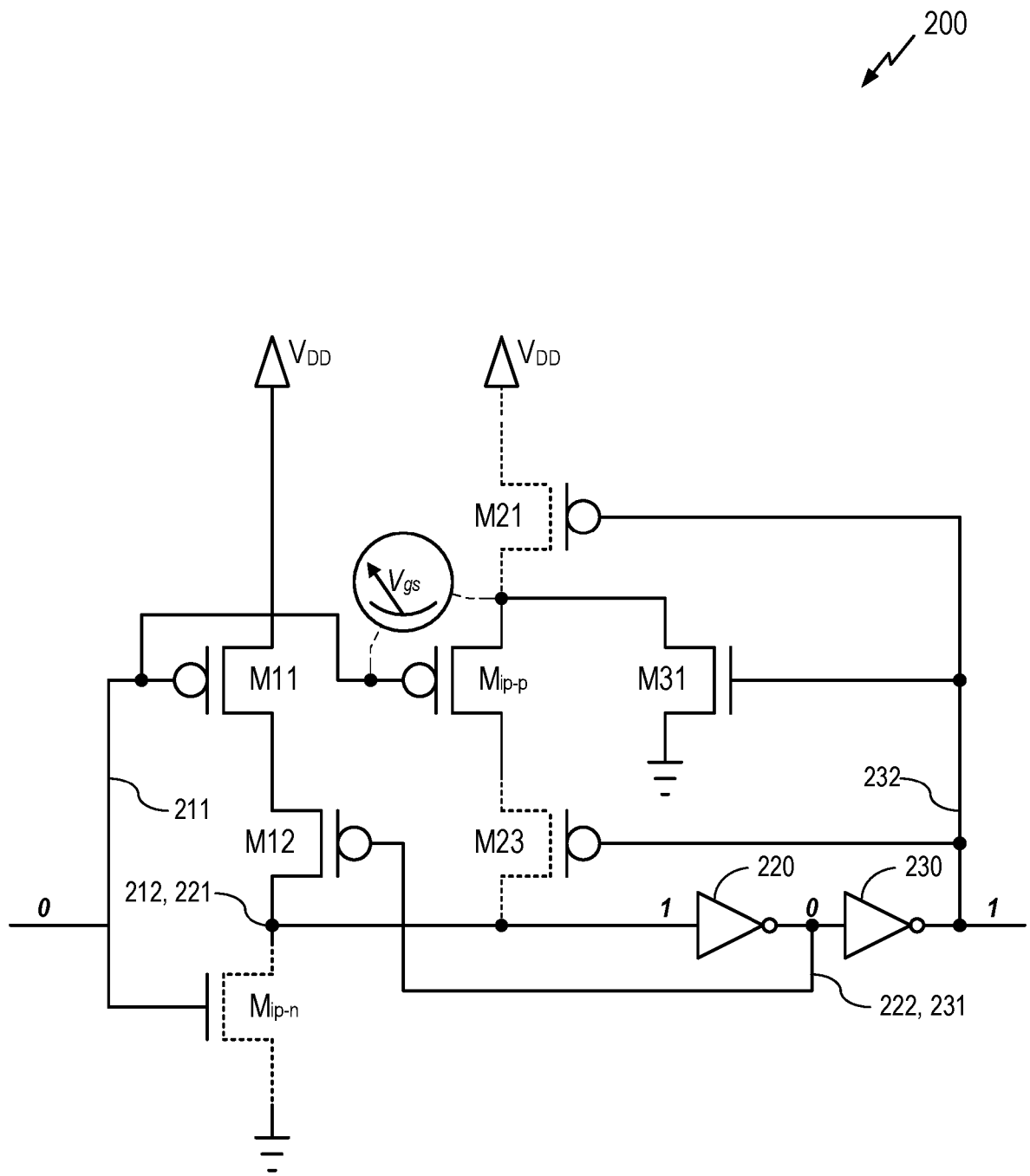
FIG. 3 generally illustrates the series of inverters of FIG. 2 when provided with a low voltage at an input.

FIG. 3 generally illustrates the series of inverters 200 of FIG. 2 when provided with a low voltage (signified as a '0') at the first inverter input node 211 of the first inverter 210.

When a logic zero is provided to the first inverter input node 211, the first stack input PMOS M11 and the inverter pair PMOS $M_{ip-p}$ are turned ON while the inverter pair NMOS $M_{ip-n}$ is turned OFF. In the present disclosure transistors that are turned ON are depicted with solid lines, whereas transistors that are turned OFF are depicted with dashed lines. Accordingly, in FIG. 3, first stack input PMOS M11 and first stack feedback PMOS M12 are depicted with solid lines, while inverter pair NMOS $M_{ip-n}$ is depicted with dashed lines.

Because the inverter pair NMOS $M_{ip-n}$ is turned OFF, the first inverter output node 212 has no path to ground. However, the first stack input PMOS M11 and the first stack feedback PMOS M12 are turned ON. The first stack input PMOS M11 is ON because its gate is coupled to the first inverter input node 211, and the first stack feedback PMOS M12 is turned ON because its gate is coupled to the second inverter output node 222 of the second inverter 220. Accordingly, the first inverter output node 212 will have a path to the power supply $V_{DD}$ via the first stack input PMOS M11 and the first stack feedback PMOS M12 but no path to ground. The first inverter 210 therefore generates a logic one at the first inverter output node 212 in response to having been provided with a logic zero at the first inverter input node 211. The logic one is provided to the second inverter input node 221 of the second inverter 220, as depicted in FIG. 3.

As noted above, the gate of the inverter pair PMOS $M_{ip-p}$ is coupled to the first inverter input node 211. Because the logic zero has been provided to the first inverter input node 211, the inverter pair PMOS $M_{ip-p}$ is turned ON. However, the first feedback PMOS M21 and the second feedback PMOS M23 are turned OFF because the respective gates thereof are coupled to the third inverter output node 232 of the third inverter 230. As a result, the source of the inverter pair PMOS $M_{ip-p}$ has no path to the power supply $V_{DD}$.

Moreover, the balancing NMOS M31, which also has a gate coupled to the third inverter output node 232 of the third inverter 230, is turned ON. As a result, the source of the inverter pair PMOS $M_{ip-p}$ has a path to ground via the balancing NMOS M31. Accordingly, the gate and source of the inverter pair PMOS $M_{ip-p}$ are both at logic zero, and the gate-source voltage differential $V_{gs}$ associated with the inverter pair PMOS $M_{ip-p}$ is low. As a result, the first inverter 210 is "PMOS-protected", in that the arrangement of transistors protects the inverter pair PMOS $M_{ip-p}$ from BTI degradation.

Figure 4:
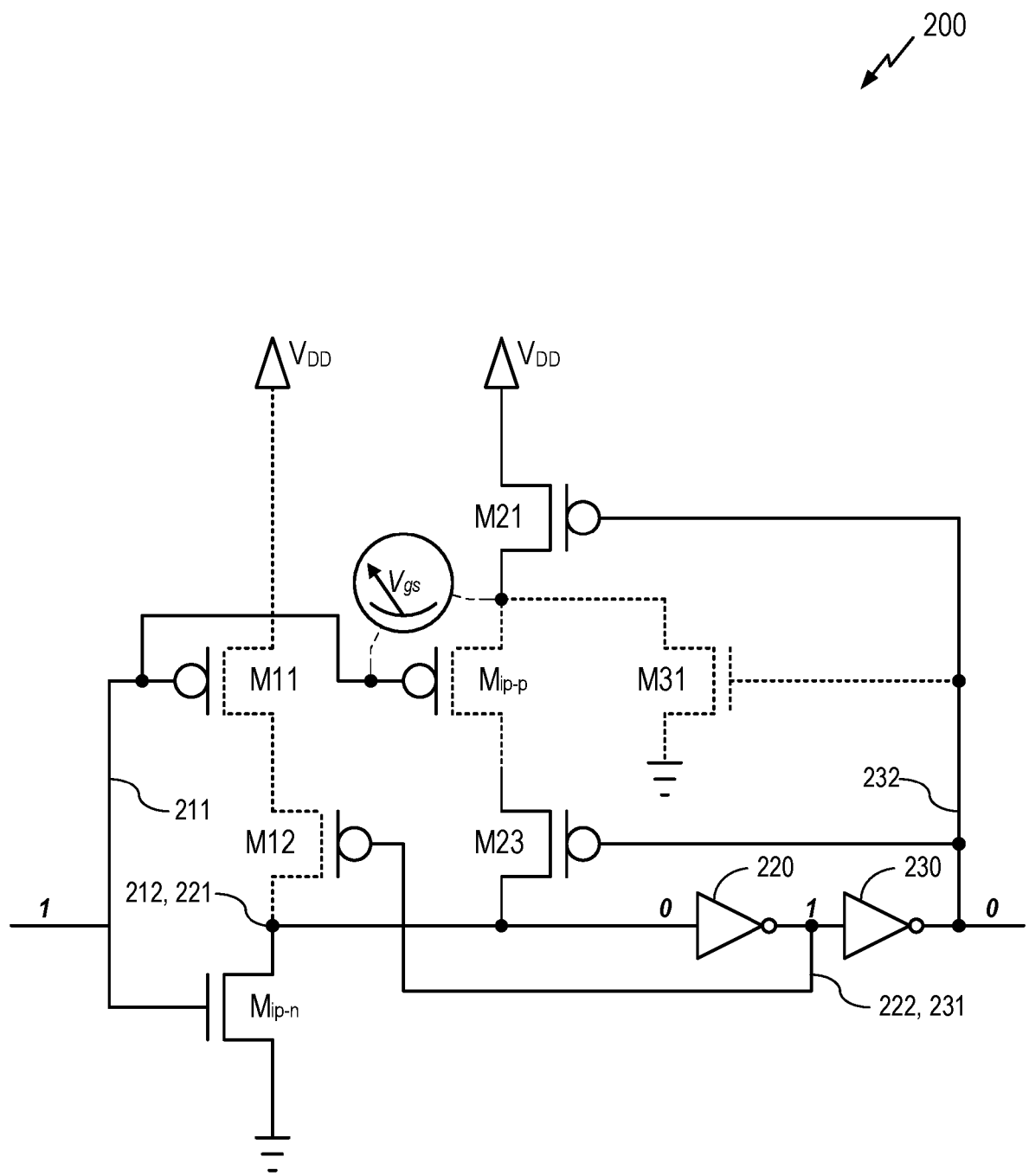
FIG. 4 generally illustrates the series of inverters of FIG. 2 when provided with a high voltage at an input.

FIG. 4 generally illustrates the same series of inverters 200 of FIG. 2 when provided with a high voltage at the first inverter input node 211 of the first inverter 210.

When a logic one is provided to the first inverter input node 211, the first stack input PMOS M11 and the inverter pair PMOS $M_{ip-p}$ are turned OFF while the inverter pair NMOS $M_{ip-n}$ is turned ON. Because the inverter pair NMOS $M_{ip-n}$ is turned ON, the first inverter output node 212 has a path to ground.

The first stack input PMOS M11 and the first stack feedback PMOS M12 are turned OFF. The first stack feedback PMOS M12 is turned OFF because its gate is coupled to the second inverter output node 222 of the second inverter 220. Overall, the first inverter output node 212 will have a path to ground via the $M_{ip-n}$ but no path to the power supply $V_{DD}$. The first inverter 210 therefore generates a logic zero at the first inverter output node 212 in response to having been provided with a logic one at the first inverter input node 211. The logic zero is provided to the second inverter input node 221 of the second inverter 220, as depicted in FIG. 4.

As noted above, the gate of the inverter pair PMOS $M_{ip-p}$ is coupled to the first inverter input node 211. Because the logic one has been provided to the first inverter input node 211, the inverter pair PMOS $M_{ip-p}$ is turned OFF. Moreover, the first feedback PMOS M21 is turned ON because its gate is coupled to the third inverter output node 232 of the third inverter 230. As a result, the source of the inverter pair PMOS $M_{ip-p}$ has a path to the power supply $V_{DD}$. The balancing NMOS M31, which has a gate coupled to the third inverter output node 232 of the third inverter 230, is turned OFF. As a result, the source of the inverter pair PMOS $M_{ip-p}$ does not have a path to ground via the balancing NMOS M31. Accordingly, the gate and source of the inverter pair PMOS $M_{ip-p}$ are both at logic one, and the gate-source voltage differential $V_{gs}$ associated with the inverter pair PMOS $M_{ip-p}$ is low. As will be understood from FIGS. 3-4, the first inverter 210 is PMOS-protected regardless of whether the inverter input is sustained for a long duration at a logic zero or a logic one.

Figure 5:
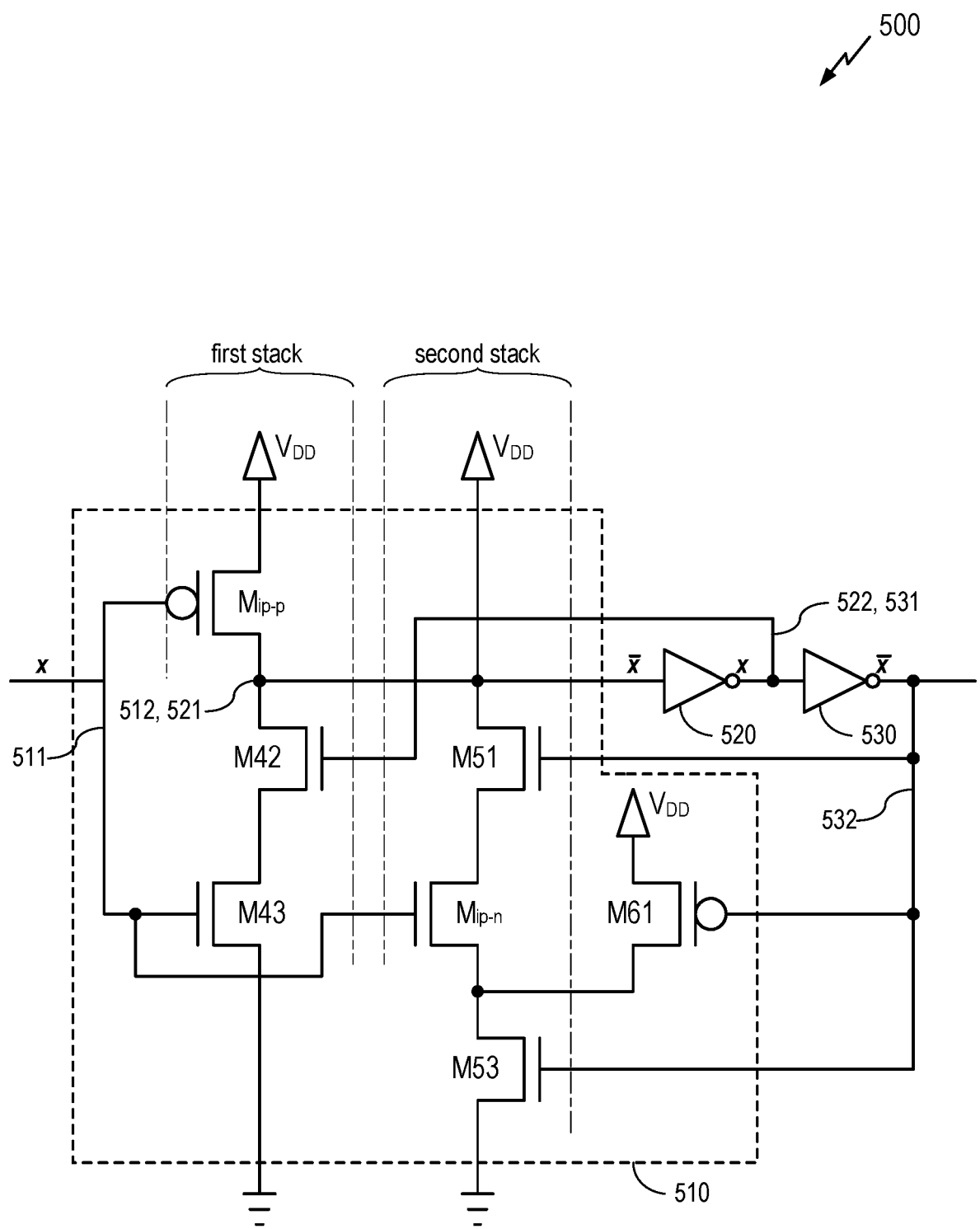
FIG. 5 generally illustrates another series of inverters in accordance with aspects of the disclosure.

FIG. 5 generally illustrates another series of inverters 500 in accordance with aspects of the disclosure.

Like the series of inverters 200, the series of inverters 500 may be analogous in some respects to the series of inverters 100. In particular, the series of inverters 500 may include a first inverter 510, a second inverter 520, and a third inverter 530. The first inverter 510 may have a first inverter input node 511 and a first inverter output node 512, the second inverter 520 may have a second inverter input node 521 and a second inverter output node 522, and the third inverter 530 may have a third inverter input node 531 and a third inverter output node 532. Each inverter in the series of inverters 500 may receive a logic zero or logic one at an input node and generate the inverse at an output node. The series of inverters 500 are daisy-chained such that the output of one inverter is the input of the next inverter.

The first inverter 510 includes an inverter pair PMOS $M_{ip-p}$ and an inverter pair NMOS $M_{ip-n}$ that are analogous in some respects to the inverter pair PMOS $M_{ip-p}$ and the inverter pair NMOS $M_{ip-n}$ depicted in FIG. 1. For example, like the inverter pair PMOS $M_{ip-p}$ depicted in FIG. 1, the inverter pair PMOS $M_{ip-p}$ depicted in FIG. 5 may include a source coupled to a power supply $V_{DD}$, a drain coupled to the first inverter output node 512, and a gate coupled to the first inverter input node 511. Moreover, like the inverter pair NMOS $M_{ip-n}$ depicted in FIG. 1, the inverter pair PMOS $M_{ip-n}$ depicted in FIG. 5 may include a gate that is coupled to the first inverter input node 511.

However, unlike the arrangement depicted in FIG. 1, the inverter pair PMOS $M_{ip-p}$ is included in a first stack of transistors and the inverter pair NMOS $M_{ip-n}$ is included in a second stack of transistors. As noted above, it will be understood that the terms "first stack" and "second stack" do not imply anything about the relative arrangement of the transistors during fabrication, or the physical structure/disposition of the transistors themselves.

The first stack of transistors may include the inverter pair PMOS $M_{ip-p}$, a first stack feedback NMOS M42, and the first stack input NMOS M43. The inverter pair PMOS $M_{ip-p}$ may include a source coupled to the power supply $V_{DD}$ and a drain coupled to the first stack feedback NMOS M42. As noted above, the gate of the inverter pair PMOS $M_{ip-p}$ is coupled to the first inverter input node 511. The first stack feedback NMOS M42 may include a gate coupled to the output of the second inverter 520 (i.e., the second inverter output node 522) and a source coupled to the first stack input NMOS M43. The first stack input NMOS M43 may include a gate coupled to the first inverter input node 511 of the first inverter 510 and a source coupled to ground.

The second stack of transistors may include a first feedback NMOS M51, the inverter pair NMOS $M_{ip-n}$, and a second feedback NMOS M53. The first feedback NMOS M51 may include a drain coupled to the power supply $V_{DD}$, a gate coupled to the third inverter output node 532 of the third inverter 530, and a source coupled to a drain of the inverter pair NMOS $M_{ip-n}$. The inverter pair NMOS $M_{ip-n}$ may include a gate coupled to the input of the first inverter 510 (i.e., the first inverter input node 511) and a source coupled to the second feedback NMOS M53. The second feedback NMOS M53 may include a gate coupled to the output of the third inverter 530 (i.e., the third inverter output node 532) and a source coupled to ground.

In addition to the first stack of transistors and the second stack of transistors, the first inverter 510 may further include a balancing PMOS M61. The balancing PMOS M61 may be an PMOS. The balancing PMOS M61 may include a drain coupled to the source of the inverter pair NMOS $M_{ip-n}$, a gate coupled to the third inverter output node 532 of the third inverter 530, and a drain coupled to the power supply $V_{DD}$.

Returning to the arrangement of transistors in FIG. 1, it will be recalled that when the input to the first inverter 110 is sustained at a high voltage for a long duration, the voltage $V_{gs}$ associated with the inverter pair NMOS $M_{ip-n}$ also remains high for the long duration, leading to BTI degradation of the inverter pair NMOS $M_{ip-n}$. By contrast, the arrangement of transistors depicted in FIG. 5 operates to increase a voltage at a source of the inverter pair NMOS $M_{ip-n}$ in response to a high voltage received at the first inverter input node 511 of the first inverter 510. Accordingly, the inverter pair NMOS $M_{ip-n}$ is less subject to BTI degradation when provided in the arrangement depicted in FIG. 5.

In some implementations, a clock buffer may be formed out of some combination of the first inverter 110 depicted in FIG. 1, the first inverter 210 depicted in FIG. 2, and/or the first inverter 510 depicted in FIG. 5. The clock buffer may typically receive an oscillating clock signal (i.e., logic zero followed by logic one, followed by logic zero, followed by logic one, and so on). However, when the clock implements, for example, a clock gating technique, the clock buffer may be subjected to a sustained logic zero of long duration. If the clock buffer consists entirely of inverters analogous to the first inverter 110 depicted in FIG. 1, then each inverter that is exposed to the logic zero (i.e., the first, the third, the fifth, and so on) may be at risk of BTI degradation of the inverter pair PMOS $M_{ip-p}$. Accordingly, a designer may replace the first inverter, third inverter, fifth inverter, etc., with inverters analogous to the first inverter 210 depicted in FIG. 2.

It will be further understood that in the clock-gating scenario described above, the second inverter, fourth inverter, sixth inverter, etc., may each be subjected to a sustained logic one of long duration. As noted above, if a conventional inverter analogous to the first inverter 110 depicted in FIG. 1 is subjected to a logic one for a long period of time, the inverter pair NMOS $M_{ip-n}$ may be at risk of BTI degradation. Accordingly, a designer may replace the second inverter, fourth inverter, sixth inverter, etc., with inverters analogous to the first inverter 510 depicted in FIG. 5.

A skilled artisan will appreciate that if the clock buffer is designed with an inverter sequence consisting entirely of odd-numbered inverters analogous to the first inverter 210 and even-numbered inverters analogous to the first inverter 510, then each inverter in the clock buffer may be at reduced risk of BTI degradation due to a long-duration input of a logic zero.

Figure 6:
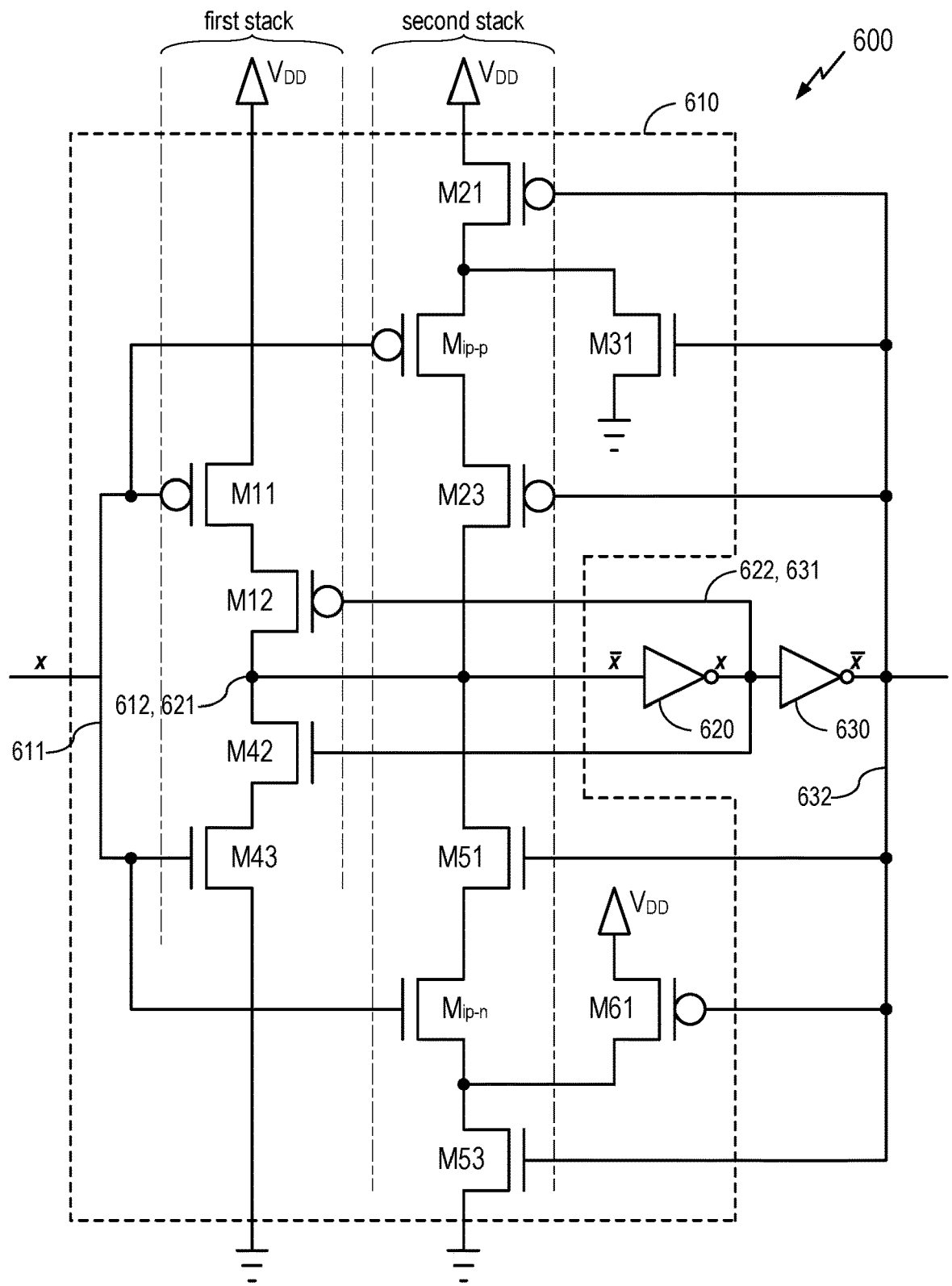
FIG. 6 generally illustrates yet another series of inverters in accordance with aspects of the disclosure.

FIG. 6 generally illustrates another series of inverters 600 in accordance with aspects of the disclosure.

As noted above, the series of inverters 200 and the series of inverters 500 include arrangements of transistors that prevent the inverter pair PMOS $M_{ip-p}$ and the inverter pair NMOS $M_{ip-n}$, respectively, from experiencing a high gate-source voltage differential $V_{gs}$. As will be discussed in greater detail below, the series of inverters 600 includes an arrangement of transistors that prevents high gate-source voltage differentials at both the inverter pair PMOS $M_{ip-p}$ and the inverter pair NMOS $M_{ip-n}$.

The series of inverters 600 includes a first inverter 610, a second inverter 620, and a third inverter 630. The first inverter 610 may have a first inverter input node 611 and a first inverter output node 612, the second inverter 620 may have a second inverter input node 621 and a second inverter output node 622, and the third inverter 630 may have a third inverter input node 631 and a third inverter output node 632. In FIG. 6, the first inverter 610 is depicted in detail. Similar to the arrangements depicted in FIG. 2 and FIG. 5, certain transistors in the first inverter 610 may be arranged in a first stack and a second stack. Moreover, the first inverter 610 includes an inverter pair PMOS $M_{ip-p}$ and an inverter pair NMOS $M_{ip-n}$, both of which have gates coupled to the first inverter input node 611.

The first stack includes a first stack input PMOS M11, a first stack feedback PMOS M12, a first stack feedback NMOS M42, and a first stack input NMOS M43. The first inverter input node 611 may be coupled to the gates of the first stack input PMOS M11 and the first stack input NMOS M43. The first stack input PMOS M11 may have a source coupled to a power supply $V_{DD}$ and a drain coupled to the first stack feedback PMOS M12. The first stack feedback PMOS M12 may have drain coupled to the first inverter output node 612. The first stack feedback NMOS M42 may have a drain coupled to the first inverter output node 612 and a source coupled to the first stack input NMOS M43. The first stack input NMOS M43 may have a source coupled to ground.

The second stack includes a first feedback PMOS M21, the inverter pair PMOS $M_{ip-p}$, a second feedback PMOS M23, a first feedback NMOS M51, the inverter pair NMOS $M_{ip-n}$, and a second feedback NMOS M53. As noted above, the first inverter input node 611 is coupled to the gates of the inverter pair PMOS $M_{ip-p}$ and the inverter pair NMOS $M_{ip-n}$. The first feedback PMOS M21 has a source coupled to the power supply $V_{DD}$, a gate coupled to the third inverter input node 631 of the third inverter 630, and a drain coupled to the inverter pair PMOS $M_{ip-p}$. The inverter pair PMOS $M_{ip-p}$ has a drain coupled to the second feedback PMOS M23. The second feedback PMOS M23 has a drain coupled to the first inverter output node 612. The first feedback NMOS M51 has a drain coupled to the first inverter output node 612 and a source coupled to the inverter pair NMOS $M_{ip-n}$. The inverter pair NMOS $M_{ip-n}$ has a source coupled to a drain of the second feedback NMOS M53. The second feedback NMOS M53 has a source coupled to ground.

Like the first inverter 210 depicted in FIG. 2, the first inverter 610 includes a balancing NMOS M31 having a source coupled to ground. Like the first inverter 510 depicted in FIG. 5, the first inverter 610 includes a balancing PMOS M61 having a source coupled to the power supply $V_{DD}$. The balancing NMOS M31 has a drain coupled to a source of the inverter pair PMOS $M_{ip-p}$, and the balancing PMOS M61 has a drain coupled to the source of the inverter pair NMOS $M_{ip-n}$. The gates of the balancing NMOS M31 and the balancing PMOS M61 are coupled to the third inverter output node 632 of the third inverter 630.

In accordance with aspects of the disclosure, one or more inverters from the series of inverters 200, the series of inverters 500, and/or the series of inverters 600 may be provided in a device selected from a group consisting of a set top box, a music player, a video player, an entertainment unit, a navigation device, a personal digital assistant (PDA), a fixed location data unit, a computer, a laptop, a tablet, a communications device, and a mobile phone.

Figure 7:
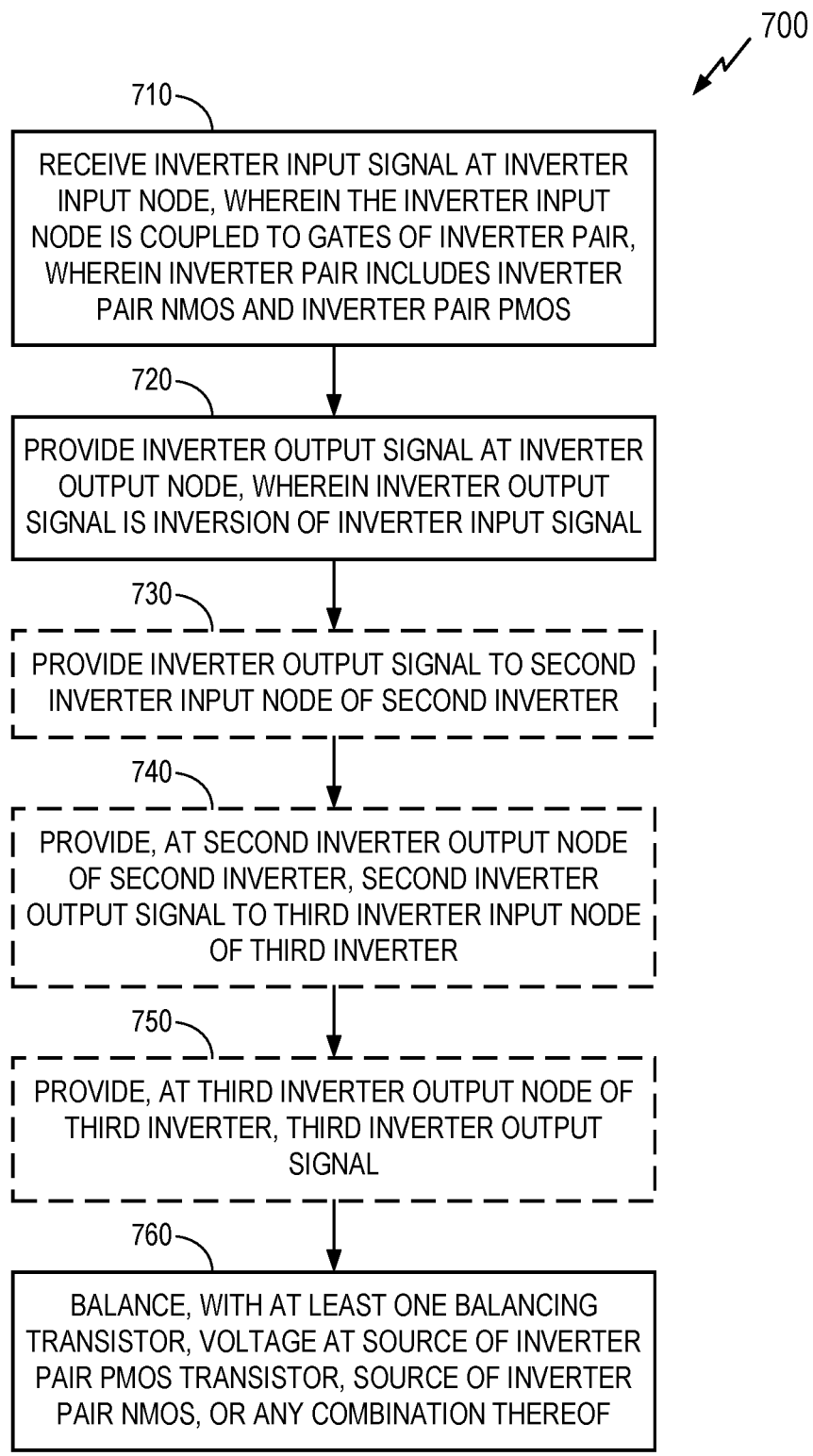
FIG. 7 generally illustrates a method of operating the series of inverters depicted in one or more of FIGS. 2, 5, and 6 in accordance with aspects of the disclosure.

FIG. 7 generally illustrates a method 700 of operating the series of inverters depicted in one or more of FIGS. 2, 5, and 6 in accordance with aspects of the disclosure.

At 710, the method 700 receives an inverter input signal at an inverter input node, wherein the inverter input node is coupled to gates of an inverter pair, wherein the inverter pair includes an inverter pair NMOS and an inverter pair PMOS. The receiving at 710 may be performed by, for example, the first inverter 210, the first inverter 510, and/or the first inverter 610. Accordingly, the first inverter 210, the first inverter 510, and/or the first inverter 610 may constitute means for receiving an input signal. The inverter input node may be analogous to the first inverter input node 211, the first inverter input node 511, and/or the first inverter input node 611. The inverter pair NMOS and the inverter pair PMOS may respectively be analogous to the inverter pair NMOS $M_{ip-n}$ and the inverter pair PMOS $M_{ip-p}$ depicted in FIGS. 2, 5, and 6.

At 720, the method 700 provides an inverter output signal at an inverter output node, wherein the inverter output signal is an inversion of the inverter input signal received at 710. The providing at 720 may be performed by, for example, the first inverter 210, the first inverter 510, and/or the first inverter 610. Accordingly, the first inverter 210, the first inverter 510, and/or the first inverter 610 may constitute means for providing an output signal. The inverter output node may be analogous to the first inverter output node 212, the first inverter output node 512, and/or the first inverter output node 612.

At 730, the method 700 optionally provides the inverter output signal to a second inverter input node of a second inverter. The optional providing at 730 may be performed by, for example, the first inverter 210, the first inverter 510, and/or the first inverter 610. Accordingly, the first inverter 210, the first inverter 510, and/or the first inverter 610 may constitute means for providing an output signal to a second means for inverting. The second inverter may be analogous to any of the second inverter 220, the second inverter 520, and/or the second inverter 620.

At 740, the method 700 optionally provides, at a second inverter output node of the second inverter, a second inverter output signal to a third input node of a third inverter. The optional providing at 740 may be performed by, for example, the second inverter 220, the second inverter 520, and/or the second inverter 620. Accordingly, the second inverter 220, the second inverter 520, and/or the second inverter 620 may constitute means for generating a second output signal, wherein the second output signal is an inversion of the output signal provided by the means for inverting. Moreover, the second inverter 220, the second inverter 520, and/or the second inverter 620 may further constitute means for providing a second output signal to a third means for inverting. The third inverter may be analogous to any of the third inverter 230, the third inverter 530, and/or the third inverter 630.

At 750, the method 700 optionally provides, at a third inverter output node of the third inverter, a third inverter output signal. The optional providing at 750 may be performed by, for example, the third inverter 230, the third inverter 530, and/or the third inverter 630. Accordingly, the third inverter 230, the third inverter 530, and/or the third inverter 630 may constitute means for generating a third output signal, wherein the third output signal is an inversion of the second output signal provided by the second means for inverting.

At 760, the method 700 balances, with at least one balancing transistor, a voltage at the source of the inverter pair PMOS $M_{ip-p}$ a source of the inverter pair NMOS $M_{ip-n}$, or any combination thereof. The balancing at 760 may be performed by, for example, the balancing NMOS M31 and/or the balancing PMOS M61. In particular, the voltage at a source of the inverter pair PMOS $M_{ip-p}$ and/or the inverter pair NMOS $M_{ip-n}$ may be balanced with the complementary voltage at a gate thereof. As a result, the gate-source voltage differential $V_{gs}$ associated with the inverter pair PMOS $M_{ip-p}$ and/or the inverter pair NMOS $M_{ip-n}$ will decrease. Accordingly, the at least one balancing transistor may constitute means for balancing a gate-source voltage differential $V_{gs}$ at a source of the inverter pair PMOS, a source of the inverter pair NMOS, or any combination thereof.

In some implementations, the means for balancing a gate-source voltage differential may be constituted by a balancing NMOS analogous to the balancing NMOS M31. In particular, the balancing NMOS may include a drain coupled to a source of the inverter pair PMOS, a source coupled to ground, and a gate coupled to the third inverter output node, wherein the balancing NMOS is configured to decrease the voltage at the source of the inverter pair PMOS in response to receiving of a low voltage at the inverter input node.

In other implementations, the means for balancing a gate-source voltage differential may be constituted by a balancing PMOS analogous to the balancing PMOS M61. In particular, the balancing PMOS may include a drain coupled to a source of the inverter pair NMOS, a source coupled to a power supply, and a gate coupled to the third inverter output node, wherein the balancing PMOS is configured to increase the voltage at the source of the inverter pair NMOS in response to receiving of a high voltage at the inverter input node.

In yet other implementations, the means for balancing a gate-source voltage differential may be constituted by a balancing NMOS analogous to the balancing NMOS M31 and a balancing PMOS analogous to the balancing PMOS M61.

The terminology used herein is for the purpose of describing particular embodiments only and not to limit any embodiments disclosed herein. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof. Similarly, the phrase "based on" as used herein does not necessarily preclude influence of other factors and should be interpreted in all cases as "based at least in part on" rather than, for example, "based solely on". Moreover, the phrase "coupled to" in electrical contexts encompasses any suitable method for delivering an electrical signal from a first node to a second node. As such, "coupled to" may encompass "coupled directly to" (for example, by direct conductive connection, such as with a copper wire, a solder ball, etc.) as well as "coupled indirectly to" (for example, having one or more intervening structures there between, such as a switch, a buffer, a filter, etc.). It will be further understood that terms such as "top" and "bottom", "left" and "right", "vertical" and "horizontal", etc., are relative terms used strictly in relation to one another, and do not express or imply any relation with respect to gravity, a manufacturing device used to manufacture the components described herein, or to some other device to which the components described herein are coupled, mounted, etc. It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not imply that there are only two elements and further does not imply that the first element must precede the second element in some manner. Also, unless stated otherwise a set of elements may comprise one or more elements. In addition, terminology of the form "at least one of A, B, or C" or "one or more of A, B, or C" or "at least one of the group consisting of A, B, and C" used in the description or the claims means "A or B or C or any combination of these elements."

Accordingly, it will be appreciated, for example, that an apparatus or any component of an apparatus may be configured to (or made operable to or adapted to) provide functionality as taught herein. This may be achieved, for example: by manufacturing (e.g., fabricating) the apparatus or component so that it will provide the functionality; by programming the apparatus or component so that it will provide the functionality; or through the use of some other suitable implementation technique. As one example, an integrated circuit may be fabricated to provide the requisite functionality. As another example, an integrated circuit may be fabricated to support the requisite functionality and then configured (e.g., via programming) to provide the requisite functionality. As yet another example, a processor circuit may execute code to provide the requisite functionality.

While the foregoing disclosure shows various illustrative aspects, it should be noted that various changes and modifications may be made to the illustrated examples without departing from the scope defined by the appended claims. The present disclosure is not intended to be limited to the specifically illustrated examples alone. For example, unless otherwise noted, the functions, steps, and/or actions of the method claims in accordance with the aspects of the disclosure described herein need not be performed in any particular order. Furthermore, although certain aspects may be described or claimed in the singular, the plural is contemplated unless limitation to the singular is explicitly stated.

What is claimed is:

1. An inverter circuit, comprising:
an inverter input node configured to receive an inverter input signal, wherein the inverter input node is coupled to gates of an inverter pair, wherein the inverter pair includes an inverter pair n-type metal-oxide-semiconductor (NMOS) transistor and an inverter pair p-type metal-oxide-semiconductor (PMOS) transistor;
an inverter output node configured to provide an inverter output signal, wherein the inverter output signal is an inversion of the inverter input signal; and
at least one balancing transistor configured to decrease a voltage difference between a source and a gate of the inverter pair PMOS, a voltage difference between a source and a gate of the inverter pair NMOS, or any combination thereof, wherein:
the inverter output node is configured to provide the inverter output signal to a second inverter input node of a second inverter;
the second inverter is configured to provide, at a second inverter output node, a second inverter output signal to a third inverter input node of a third inverter;
the third inverter is configured to provide, at a third inverter output node, a third inverter output signal; and
the inverter output node is coupled to a drain of the inverter pair NMOS and the at least one balancing transistor includes a balancing NMOS that includes:
a drain coupled to a source of the inverter pair PMOS;
a source coupled to ground; and
a gate coupled to the third inverter output node, wherein the balancing NMOS is configured to decrease the voltage at the source of the inverter pair PMOS in response to receiving of a low voltage at the inverter input node.

2. The inverter circuit of claim 1, further comprising a first stack that includes a first stack input PMOS, a first stack feedback PMOS, and the inverter pair NMOS, wherein:
the first stack input PMOS includes a source coupled to a power supply, a drain coupled to a source of the first stack feedback PMOS, and a gate coupled to the inverter input node; and
the first stack feedback PMOS includes a drain coupled to a drain of the inverter pair NMOS and a gate coupled to the second inverter output signal.

3. The inverter circuit of claim 2, further comprising a second stack that includes a first feedback PMOS, the inverter pair PMOS, and a second feedback PMOS, wherein:
the first feedback PMOS includes a source coupled to a power supply, a drain coupled to the source of the inverter pair PMOS, and a gate coupled to the third inverter output node; and
the second feedback PMOS includes a source coupled to the drain of the inverter pair PMOS, a drain coupled to the inverter output node, and a gate coupled to the third inverter output node.

4. The inverter circuit of claim 1, wherein the inverter output node is coupled to a drain of the inverter pair PMOS and the at least one balancing transistor includes a balancing PMOS that includes:
a drain coupled to a source of the inverter pair NMOS;
a source coupled to a power supply; and
a gate coupled to the third inverter output node, wherein the balancing PMOS is configured to increase the voltage at the source of the inverter pair NMOS in response to receiving of a high voltage at the inverter input node.

5. The inverter circuit of claim 4, further comprising a first stack that includes the inverter pair PMOS, a first stack feedback NMOS, and a first stack input NMOS, wherein:
the first stack feedback NMOS includes a drain coupled to the drain of the inverter pair PMOS, a source coupled to a drain of the first stack input NMOS, and a gate coupled to the second inverter output signal; and
the first stack input NMOS includes a source coupled to ground and a gate coupled to the inverter input node.

6. The inverter circuit of claim 5, further comprising a second stack that includes a first feedback NMOS, the inverter pair NMOS, and a second feedback NMOS, wherein:
the first feedback NMOS includes a drain coupled to a power supply, a source coupled to a drain of the inverter pair NMOS, and a gate coupled to the third inverter output node; and
the second feedback NMOS includes a drain coupled to a source of the inverter pair NMOS, a source coupled to ground, and a gate coupled to the third inverter output node.

7. The inverter circuit of claim 1, wherein the at least one balancing transistor includes:
a balancing NMOS that includes:
a drain coupled to the source of the inverter pair PMOS;
a source coupled to ground; and
a gate coupled to the third inverter output node, wherein the balancing NMOS is configured to decrease the voltage at the source of the inverter pair PMOS in response to receiving of a low voltage at the inverter input node; and
a balancing PMOS that includes:
a drain coupled to the source of the inverter pair NMOS;
a source coupled to a power supply; and
a gate coupled to the third inverter output node, wherein the balancing PMOS is configured to increase the voltage at the source of the inverter pair NMOS in response to receiving of a high voltage at the inverter input node.

8. The inverter circuit of claim 7, further comprising a first stack that includes a first stack input PMOS, a first stack feedback PMOS, a first stack feedback NMOS, and a first stack input NMOS, wherein:
the first stack input PMOS includes a source coupled to a power supply, a drain coupled to a source of the first stack feedback PMOS, and a gate coupled to the inverter input node;
the first stack feedback PMOS includes a drain coupled to a drain of the first stack feedback NMOS and a gate coupled to the second inverter output node;
the drain of the first stack feedback NMOS is further coupled to the inverter output node, and the first stack feedback NMOS further includes a source coupled to a drain of the first stack input NMOS and a gate coupled to the second inverter output node; and
the first stack input NMOS includes a source coupled to ground and a gate coupled to the inverter input node.

9. The inverter circuit of claim 7, further comprising a second stack that includes a first feedback PMOS, the inverter pair PMOS, a second feedback PMOS, a first feedback NMOS, the inverter pair NMOS, and a second feedback NMOS, wherein:
the first feedback PMOS includes a source coupled to a power supply, a drain coupled to the inverter pair PMOS, and a gate coupled to the third inverter output node;

the second feedback PMOS includes a source coupled to a drain of the inverter pair PMOS, a drain coupled to the first feedback NMOS, and a gate coupled to the third inverter output node;

the drain of the first feedback NMOS is further coupled to the inverter output node, and the first feedback NMOS further includes a drain further coupled to the inverter output node, a source coupled to the drain of the inverter pair NMOS, and a gate coupled to the third inverter output node; and the second feedback NMOS includes a drain coupled to the source of the inverter pair NMOS, a source coupled to ground, and a gate coupled to the third inverter output node.

10. The inverter circuit of claim 1, wherein the inverter circuit is provided in a device selected from a group consisting of a set top box, a music player, a video player, an entertainment unit, a navigation device, a personal digital assistant (PDA), a fixed location data unit, a computer, a laptop, a tablet, a communications device, and a mobile phone.

11. A method, comprising:

receiving an inverter input signal at an inverter input node, wherein the inverter input node is coupled to gates of an inverter pair, wherein the inverter pair includes an inverter pair n-type metal-oxide-semiconductor (NMOS) transistor and an inverter pair p-type metal-oxide-semiconductor (PMOS) transistor;

providing an inverter output signal at an inverter output node, wherein the inverter output signal is an inversion of the inverter input signal; and decreasing, with at least one balancing transistor, a voltage difference between a source and a gate of the inverter pair PMOS, a voltage difference between a source and a gate of the inverter pair NMOS, or any combination thereof;

providing the inverter output signal to a second inverter input node of a second inverter;

providing, at a second inverter output node of the second inverter, a second inverter output signal to a third inverter input node of a third inverter; and providing, at a third inverter output node of the third inverter, a third inverter output signal, wherein the inverter output node is coupled to a drain of the inverter pair NMOS and the at least one balancing transistor includes a balancing NMOS that includes:

a drain coupled to a source of the inverter pair PMOS;
a source coupled to ground; and
a gate coupled to the third inverter output node, wherein the balancing NMOS is configured to decrease the voltage at the source of the inverter pair PMOS in response to receiving of a low voltage at the inverter input node.

12. The method of claim 11, wherein the inverter pair NMOS is provided in a first stack that includes a first stack input PMOS and a first stack feedback PMOS, wherein:

the first stack input PMOS includes a source coupled to a power supply, a drain coupled to a source of the first stack feedback PMOS, and a gate coupled to the inverter input node; and the first stack feedback PMOS includes a drain coupled to a drain of the inverter pair NMOS and a gate coupled to the second inverter output signal.

13. The method of claim 12, the inverter pair PMOS is provided in a second stack that includes a first feedback PMOS and a second feedback PMOS, wherein:

the first feedback PMOS includes a source coupled to a power supply, a drain coupled to the source of the inverter pair PMOS, and a gate coupled to the third inverter output node; and the second feedback PMOS includes a source coupled to the drain of the inverter pair PMOS, a drain coupled to the inverter output node, and a gate coupled to the third inverter output node.

14. The method of claim 11, wherein the inverter output node is coupled to a drain of the inverter pair PMOS and the at least one balancing transistor includes a balancing PMOS that includes:

a drain coupled to a source of the inverter pair NMOS;
a source coupled to a power supply; and
a gate coupled to the third inverter output node, wherein the balancing PMOS is configured to increase the voltage at the source of the inverter pair NMOS in response to receiving of a high voltage at the inverter input node.

15. The method of claim 14, wherein the inverter pair PMOS is included in a first stack that further includes a first stack feedback NMOS and a first stack input NMOS, wherein:

the first stack feedback NMOS includes a drain coupled to the drain of the inverter pair PMOS, a source coupled to a drain of the first stack input NMOS, and a gate coupled to the second inverter output signal; and the first stack input NMOS includes a source coupled to ground and a gate coupled to the inverter input node.

16. The method of claim 15, wherein the inverter pair NMOS is included in a second stack that further includes a first feedback NMOS and a second feedback NMOS, wherein:

the first feedback NMOS includes a drain coupled to a power supply, a source coupled to a drain of the inverter pair NMOS, and a gate coupled to the third inverter output node; and the second feedback NMOS includes a drain coupled to a source of the inverter pair NMOS, a source coupled to ground, and a gate coupled to the third inverter output node.

17. The method of claim 11, wherein the at least one balancing transistor includes:

a balancing NMOS that includes:
a drain coupled to a source of the inverter pair PMOS;
a source coupled to ground; and
a gate coupled to the third inverter output node, wherein the balancing NMOS is configured to decrease the voltage at the source of the inverter pair PMOS in response to receiving of a low voltage at the inverter input node; and a balancing PMOS that includes:
a drain coupled to a source of the inverter pair NMOS;
a source coupled to a power supply; and
a gate coupled to the third inverter output node, wherein the balancing PMOS is configured to increase the voltage at the source of the inverter pair NMOS in response to receiving of a high voltage at the inverter input node.

18. The method of claim 17, further comprising receiving the inverter input signal at a first stack that includes a first stack input PMOS, a first stack feedback PMOS, a first stack feedback NMOS, and a first stack input NMOS, wherein:

the first stack input PMOS includes a source coupled to a power supply, a drain coupled to a source of the first stack feedback PMOS, and a gate coupled to the inverter input node;

the first stack feedback PMOS includes a drain coupled to a drain of the first stack feedback NMOS and a gate coupled to the second inverter output node;

the drain of the first stack feedback NMOS is further coupled to the inverter output node, and the first stack feedback NMOS further includes a source coupled to a drain of the first stack input NMOS and a gate coupled to the second inverter output node; and the first stack input NMOS includes a source coupled to ground and a gate coupled to the inverter input node.

19. The method of claim 18, wherein the inverter pair PMOS and the inverter pair NMOS are included in a second stack that further includes a first feedback PMOS, a second feedback PMOS, a first feedback NMOS, and a second feedback NMOS, wherein:

the first feedback PMOS includes a source coupled to a power supply, a drain coupled to the inverter pair PMOS, and a gate coupled to the third inverter output node;

the second feedback PMOS includes a source coupled to a drain of the inverter pair PMOS, a drain coupled to the first feedback NMOS, and a gate coupled to the third inverter output node;

the drain of the first feedback NMOS is further coupled to the inverter output node, and the first feedback NMOS further includes a drain further coupled to the inverter output node, a source coupled to the drain of the inverter pair NMOS, and a gate coupled to the third inverter output node; and the second feedback NMOS includes a drain coupled to the source of the inverter pair NMOS, a source coupled to ground, and a gate coupled to the third inverter output node.

20. The method of claim 17, wherein the method is performed in a device selected from a group consisting of a set top box, a music player, a video player, an entertainment unit, a navigation device, a personal digital assistant (PDA), a fixed location data unit, a computer, a laptop, a tablet, a communications device, and a mobile phone.

21. An apparatus, comprising means for inverting, the means for inverting comprising:

means for receiving an input signal, wherein the means for receiving an input signal includes an input node that is coupled to gates of an inverter pair, wherein the inverter pair includes an inverter pair n-type metal-oxide-semiconductor (NMOS) transistor and an inverter pair p-type metal-oxide-semiconductor (PMOS) transistor;

means for providing an output signal of the means for inverting at an output node, wherein the output signal is an inversion of the input signal;

means for decreasing a gate-source voltage differential between a source and a gate of the inverter pair PMOS, a gate-source voltage differential between a source and a gate of the inverter pair NMOS, or any combination thereof;

second means for inverting and third means for inverting, wherein:

means for inverting further comprises means for providing the output signal to the second means for inverting;

second means for inverting comprises:

means for generating a second output signal, wherein the second output signal is an inversion of the output signal provided by the means for inverting; and means for providing the second output signal to the third means for inverting; and third means for inverting comprises means for generating a third output signal, wherein the third output signal is an inversion of the second output signal provided by the second means for inverting, and wherein the means for balancing the gate-source voltage differential includes a balancing NMOS that includes:

a drain coupled to a source of the inverter pair PMOS;

a source coupled to ground; and a gate coupled to the third means for inverting, wherein the balancing NMOS is configured to decrease the voltage at the source of the inverter pair PMOS in response to receiving of a low voltage at the means for receiving the input signal.

22. The apparatus of claim 21, wherein the means for balancing the gate-source voltage differential includes a balancing PMOS that includes:

a drain coupled to a source of the inverter pair NMOS;

a source coupled to a power supply; and a gate coupled to the third means for inverting, wherein the balancing PMOS is configured to increase the voltage at the source of the inverter pair NMOS in response to receiving of a high voltage at the means for receiving the input signal.

23. The apparatus of claim 21, wherein the means for balancing the gate-source voltage differential includes:

a balancing NMOS that includes:

a drain coupled to a source of the inverter pair PMOS;

a source coupled to ground; and a gate coupled to the third means for inverting, wherein the balancing NMOS is configured to decrease the voltage at the source of the inverter pair PMOS in response to receiving of a low voltage at the means for receiving the input signal; and a balancing PMOS that includes:

a drain coupled to the source of the inverter pair NMOS;

a source coupled to a power supply; and a gate coupled to the third means for inverting, wherein the balancing PMOS is configured to increase the voltage at the source of the inverter pair NMOS in response to receiving of a high voltage at the means for receiving the input signal.

24. The apparatus of claim 21, wherein the apparatus is provided in a device selected from a group consisting of a set top box, a music player, a video player, an entertainment unit, a navigation device, a personal digital assistant (PDA), a fixed location data unit, a computer, a laptop, a tablet, a communications device, and a mobile phone.

* * * * *